United States Patent
Yokozawa

(10) Patent No.: US 7,777,794 B2
(45) Date of Patent: Aug. 17, 2010

(54) SOLID-STATE IMAGING DEVICE AND METHOD OF MANUFACTURING THE SAME

(75) Inventor: Kenji Yokozawa, Shiga (JP)

(73) Assignee: Panasonic Corporation, Osaka (JP)

( * ) Notice: Subject to any disclaimer, the term of this patent is extended or adjusted under 35 U.S.C. 154(b) by 569 days.

(21) Appl. No.: 11/557,270

(22) Filed: Nov. 7, 2006

(65) Prior Publication Data
US 2007/0103572 A1     May 10, 2007

(30) Foreign Application Priority Data
Nov. 10, 2005 (JP) ............................. 2005-326325

(51) Int. Cl.
*H04N 5/225* (2006.01)
(52) U.S. Cl. ...................... 348/272; 348/340
(58) Field of Classification Search ......... 348/272–275, 348/222.1, 340
See application file for complete search history.

(56) References Cited

U.S. PATENT DOCUMENTS

| 4,710,803 | A | * | 12/1987 | Suzuki et al. | ............... | 348/275 |
| 4,882,616 | A | * | 11/1989 | Manabe | ....................... | 348/273 |
| 2003/0124763 | A1 | * | 7/2003 | Fan et al. | ..................... | 438/70 |
| 2005/0270594 | A1 | * | 12/2005 | Kobayashi | .................. | 358/482 |
| 2006/0077268 | A1 | | 4/2006 | Yokozawa | | |
| 2006/0158547 | A1 | * | 7/2006 | Komatsu et al. | ............ | 348/340 |

FOREIGN PATENT DOCUMENTS

| JP | 5-110044 | | 4/1993 |
| JP | 11-150252 | | 6/1999 |
| JP | 2005-123225 | | 5/2005 |
| JP | 2005123225 | A * | 5/2005 |

* cited by examiner

*Primary Examiner*—Tuan Ho

(57) ABSTRACT

A solid-state imaging device includes: a semiconductor substrate; a plurality of photoelectric conversion elements that are arranged in a matrix form on the semiconductor substrate; and color filter layers of a plurality of colors that are formed in a predetermined pattern above the photoelectric conversion elements. A green color filter portion having a predetermined width is formed above a boundary region between each pair of adjacent ones of the photoelectric conversion elements so as to have a cross section of a mountain shape or a trapezoidal shape. Each of the color filter layers is formed between respective ridgelines of adjacent ones of the green color filter portions. Each of the color filter layers has a thickness that is smaller at a peripheral portion corresponding to a ridgeline portion than at a central portion. Thus, a solid-state imaging device that prevents color mixture caused by light from an adjacent color filter layer and remedies the problems of line shading, variations in sensitivity and color irregularity and a method of manufacturing the same are provided.

15 Claims, 7 Drawing Sheets

SOLID-STATE IMAGING DEVICE AND METHOD OF MANUFACTURING THE SAME

BACKGROUND OF THE INVENTION

1. Field of the Invention

The present invention relates to a solid-state imaging device including: a semiconductor substrate, a plurality of photoelectric conversion elements that are arranged on the semiconductor substrate, and color filter layers of a plurality of colors that are formed in a predetermined pattern above the plurality of photoelectric conversion elements, and a method of manufacturing the same.

2. Description of Related Art

In a color solid-state imaging device, for the formation of color images, color filter layers (dye layers) corresponding respectively to photoelectric conversion elements are formed in accordance with a predetermined arrangement (see, for example, JP11-150252 A). Hereinafter, the structure of a conventional solid-state imaging device having color filter layers will be described briefly.

Generally, for a single-plate color solid-state imaging device in which a color filter of three primary colors is used with respect to one solid-state imaging device for the formation of color images, a color filter of a Bayer arrangement as shown in FIG. 9 often is used. In a color filter layer 20 shown in the figure, green color filter layers 20G (without hatching) are arranged so as to form a checkered pattern, and gaps in the checkered pattern are occupied alternately by blue color filter layers 20B (with vertical hatching) and red color filter layers 20R (with horizontal hatching). That is, on one line (A-A" line), the green and blue color filter layers are arrayed in an alternate and repeated manner, while on a line adjacent thereto (B-B" line), the red and green color filter layers are arrayed in an alternate and repeated manner.

FIG. 10 is a diagram schematically showing a cross section of the conventional solid-state imaging device along the A-A" line of FIG. 9. The following briefly describes a cross-sectional structure of this solid-state imaging device. That is, a P-type well layer 12 is formed on a N-type semiconductor substrate 11, and on the P-type well layer 12, a plurality of photoelectric conversion elements 13 that perform photoelectric conversion are formed as N-type semiconductor layers. Further, a gate insulation film 14 that covers the P-well layer 12 and the photoelectric conversion elements 13 is formed, and a transfer electrode 15 that performs signal transfer is formed in a position corresponding to a portion between the photoelectric conversion elements 13.

Moreover, an interlayer insulation film 16 is formed so as to cover the transfer electrode 15, and a light-blocking film 17 is formed so as to cover the interlayer insulation film 16. The light-blocking film 17 prevents the incidence of undesired light on the transfer electrode 15. Further, a surface protection film 18 is formed so as to cover the gate insulation film 14, the light-blocking films 17 and the like, and a first transparent planarization film 19a that fills each concave portion on a surface of the surface protection film 18 is formed. A second transparent planarization film 19b made of a thermosetting transparent resin is formed on respective surfaces of the surface protection film 18 and the first transparent planarization films 19a, which now form a planarized surface, and the color filter layer 20 is formed on the second transparent planarization film 19b. The second transparent planarization film 19b improves an adhesion property of the color filter layer 20 and also reduces a development residue. A third transparent planarization film 19c is formed on the color filter layer 20, and on the third transparent planarization film 19c, a microlens 21 is formed with respect to each pixel. The microlens 21 enhances the light-condensing efficiency of each pixel with respect to a corresponding one of the photoelectric conversion elements 13.

The color filter layer 20 is an aggregation of color filter layers, each having a predetermined dye (red, green or blue) with respect to each pixel. In FIG. 10 showing the cross section along the A-A" line of FIG. 9, the blue color filter layers 20B and the green color filter layers 20G are formed alternately. In the conventional solid-state imaging device described in JP11-150252 A, each of the green color filter layers 20G being large in number is formed so as to have an area larger than an area of the blue color filter layer 20B. Moreover, an edge portion of the green color filter layer 20G (an interface between the green color filter layer 20G and another color filter layer) is formed diagonally so that an area in which the green color filter layers 20G are in contact with the second transparent planarization film 19b is increased further. This makes the color filter layer 20 resistant to peeling.

In the cross section shown in FIG. 10, compared with a pixel size, the size of the green color filter layer 20G is increased, and the size of the blue color filter layer 20B adjacent thereto is decreased accordingly. Therefore, in the case where blue light is incident on a boundary portion between a green pixel and a blue pixel as shown in FIG. 10, the blue light is absorbed in the green color filter layer 20G, and thus an amount of light reflected diffusely on a surface of the light-blocking film 17 or the like is decreased. As a result, the amount of light received by the photoelectric conversion element 13G positioned under the green color filter layer 20G interposed between the blue color filter layers 20B hardly changes.

FIG. 11 is a diagram schematically showing a cross section of the conventional solid-state imaging device along the B-B" line of FIG. 9. This cross-sectional view is different from the cross-sectional view shown in FIG. 10 only in the configuration of the color filter layer 20. That is, in this cross section, the green color filter layers 20G and the red color filter layers 20R are formed alternately.

Also in the cross section shown in FIG. 11, compared with the pixel size, the size of the green color filter layer 20G is increased, and the size of the red color filter layer 20R adjacent thereto is decreased accordingly. Therefore, in the case where blue light is incident, the blue light is absorbed in the green color filter layer 20G, and thus an amount of light reflected diffusely on the surface of the light-blocking film 17 or the like is decreased. As a result, the amount of light received by the photoelectric conversion element 13G under the green color filter layer 20G interposed between the red color filter layers 20R hardly changes.

That is, as shown in FIGS. 10 and 11, in the case where, compared with the pixel size, the size of the green color filter layer 20G is increased, and the respective sizes of the blue color filter layer 20B and the red color filter layer 20R that are adjacent thereto are decreased accordingly, no difference is produced between the amount of light received by the photoelectric conversion element 13G of a green pixel interposed between the blue color filter layers 20B and the amount of light received by the photoelectric conversion element 13G of a green pixel interposed between the red color filter layers 20R.

The same holds true for the case where red light is incident. The red light is absorbed in the green color filter layer 20G. Therefore, the amount of light received by the photoelectric conversion element 13G under the green color filter layer 20G interposed between the blue color filter layers 20B hardly changes, and neither does the amount of light received by the photoelectric conversion element 13G under the green color filter layer 20G interposed between the red color filter layers 20R. Thus, no difference is produced between these amounts.

As described above, line shading that occurs due to a difference in green sensitivity between on the A-A" line and on the B-B" line of FIG. 9 is suppressed by a method in which the green color filter layers are formed in a size larger than a pixel size. Further, JP 5-110044 A describes a structure in which a black filter portion is formed on a portion between each pair of adjacent pixels to block light incidence.

However, the conventional solid-state imaging device having color filter layers that are formed so that green color filter layers have a size larger than a pixel size as described above presents the following problems.

Firstly, in the case where oblique light is incident, since the green color filter layers are formed in an increased size, light that has been transmitted through the green color filter layer is incident on the blue color filter layer or the red color filter layer that is adjacent thereto to cause color mixture, and thus high-definition images cannot be obtained.

Secondly, when oblique light is incident in the cross section on the A-A" line of FIG. 9 as shown in FIG. 12, after being transmitted through the green color filter layer 20G, this light is incident on the photoelectric conversion element 13B of a blue pixel under the blue color filter layer 20B adjacent to the green color filter layer 20G. As a result, with respect to a blue spectral characteristic, part of a long wavelength component in green light is added, resulting in an increase in blue sensitivity. Similarly, when oblique light is incident in the cross section on the B-B" line of FIG. 9 as shown in FIG. 13, after being transmitted through the green color filter layer 20G, this light is incident on the photoelectric conversion element 13R of a red pixel under the red color filter layer 20R adjacent to the green color filter layer 20G. As a result, with respect to a red spectral characteristic, part of a component in the green light is added, resulting in an increase in red sensitivity.

Thirdly, in the case where line shading is suppressed by the method in which green color filter layers are formed in a size larger than a pixel size (resizing), it is difficult to optimize an amount of the resizing so as to correspond to a solid-state imaging device. That is, it is extremely difficult to determine a resizing amount that allows the influence of oblique light to be reduced and is effective in suppressing line shading.

Furthermore, with a color resist forming a color filter layer coated in an increased thickness, in an exposure process step in a photolithography technique, i-rays are absorbed by the color resist and hardly reach a deep portion. Because of this, only an insufficient degree of photopolymerization occurs in the deep portion, so that film peeling becomes more likely to occur. Meanwhile, in order to obtain a desired spectral characteristic, a color resist is required to be coated in a somewhat large thickness. Moreover, it is extremely difficult to obtain pigment particles in the form of fine particles, and even if such particles are obtained successfully, it is inevitable that an increase in secondary particle diameter occurs as a result of a dispersion treatment, which hinders the reduction of thickness for a pigment-dispersed color resist.

Furthermore, in the conventional solid-state imaging device, as previously described, each color filter layer has an edge portion that is not perpendicular to but oblique to a substrate. That is, green color filter layers that are formed first have a cross section of a trapezoidal shape (upper base dimension<lower base dimension). Color filter layers (of, for example, blue and red colors) that are formed second and third are formed so as to fill gaps in a pattern of the color filter layers that are formed first and thus have a cross section of a trapezoidal shape having an upper base dimension larger than its lower base dimension. As a result, as shown in FIGS. 12 and 13, it is more likely that oblique incident light is transmitted through an edge portion of a color filter layer of an adjacent pixel. Because of this, a desired spectral characteristic cannot be obtained, and color mixture occurs.

Moreover, there also is a problem that the use of microscopic pixels leads to deterioration of an alignment margin in a cross-sectional shape of a color filter layer. When an alignment deviation occurs, due to incident light being transmitted through a peripheral portion of a color filter layer of an adjacent pixel, a greater degree of color mixture occurs, and thus a desired spectral characteristic cannot be obtained.

In addition, when green color filter layers are formed in a checkered pattern in a color filter of the Bayer arrangement, if a color filter resist material having poor resolution is used, the shape of an edge portion at a peripheral portion of each color filter layer may be deteriorated, and in a worst case, the edge portion of the color filter layer may be distorted. Such a distortion of the edge portion occurs in an irregular manner and thus is difficult to prevent through designing of a mask.

SUMMARY OF THE INVENTION

Therefore, with the foregoing in mind, it is an object of the present invention to provide a solid-state imaging device that can remedy the problems of color mixture caused by light from an adjacent color filter layer, line shading, and variations in sensitivity, and a method of manufacturing the same.

A solid-state imaging device according to the present invention includes: a semiconductor substrate; a plurality of photoelectric conversion elements that are arranged on the semiconductor substrate; and color filter layers of a plurality of colors that are formed in a predetermined pattern above the plurality of photoelectric conversion elements. In the solid-state imaging device, a green color filter portion having a predetermined width is formed above a boundary region between each pair of adjacent ones of the photoelectric conversion elements so as to have a cross section of a mountain shape or a trapezoidal shape. Further, each of the color filter layers of a plurality of colors is formed between respective ridgelines of the green color filter portions so as to have a thickness that is smaller at a peripheral portion positioned in a ridgeline portion of the green color filter portion than at a central portion.

Furthermore, a solid-state imaging device according to another aspect of the present invention includes: a semiconductor substrate; a plurality of photoelectric conversion elements that are arranged in a matrix form on the semiconductor substrate; and color filter layers of a plurality of colors that are formed in a predetermined pattern above the plurality of photoelectric conversion elements. In the solid-state imaging device, a green color filter portion having a predetermined width is formed above a boundary region between each pair of adjacent ones of the photoelectric conversion elements so as to form a lattice when viewed in a plan view and have a cross section of a mountain shape or a trapezoidal shape. Further, each of the color filter layers of a plurality of colors is formed in a rectangular region interposed between respective ridgelines of the green color filter portions. Also in this case, preferably, each of the color filter layers is formed so as to have a thickness that is smaller at a peripheral portion corresponding to a ridgeline portion of the green color filter portion than at a central portion.

Furthermore, a method of manufacturing a solid-state imaging device according to the present invention is a method of manufacturing a solid-state imaging device including: a semiconductor substrate; a plurality of photoelectric conversion elements that are arranged on the semiconductor substrate; and color filter layers of a plurality of colors that are formed in a predetermined pattern above the plurality of photoelectric conversion elements. The method includes process steps of forming a green color filter portion having a predetermined width and a cross section of a mountain shape or a trapezoidal shape above a boundary region between each pair of adjacent ones of the photoelectric conversion elements; and forming each of the color filter layers of a plurality of colors between respective ridgelines of the green color filter portions so that the each of the color filter layers has a thickness that is smaller at a peripheral portion corresponding to a ridgeline portion of the green color filter portion than at a central portion.

DETAILED DESCRIPTION OF THE INVENTION

In the solid-state imaging device according to the present invention, preferably, each of the color filter layers is formed so as to have a thickness that is smaller at a peripheral portion positioned in a ridgeline portion of the green color filter portion than at a central portion.

Further, preferably, the green color filter portion is formed so as to have a thickness equal to or smaller than a thickness of the color filter layers. Further, preferably, the green color filter portion is formed so as to have a width equal to or smaller than a width of a light-blocking film that is formed on a transfer electrode formed above the boundary region between each pair of adjacent ones of the photoelectric conversion elements.

Furthermore, preferably, the method of manufacturing a solid-state imaging device according to the present invention further includes a process step of forming a microlens above each of the color filter layers, and in the process step of forming the green color filter portion, a photomask for forming the microlens is used also to form the green color filter portion. In this case, preferably, a negative-type resist is used to form the green color filter portion, and a positive-type resist is used to configure the microlens.

Such use of one photomask both to form a green color filter portion and to form a microlens can contribute to reducing the manufacturing cost of a solid-state imaging device.

Hereinafter, the present invention will be described by way of an embodiment with reference to the appended drawings.

Figure 1:
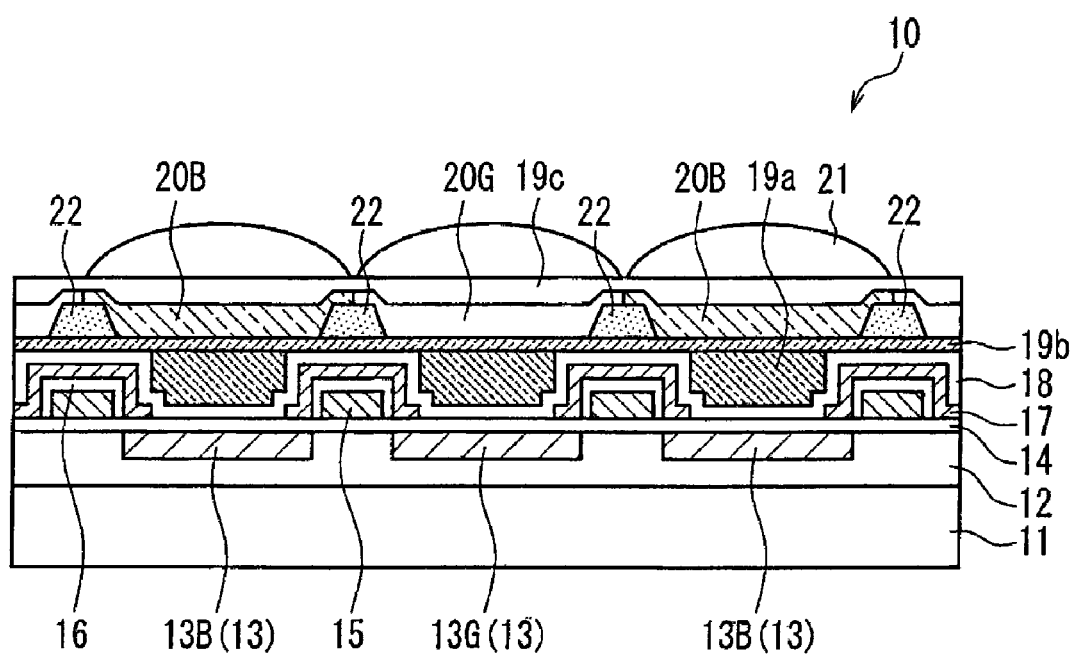
FIG. 1 is a diagram schematically showing a cross-sectional configuration of a solid-state imaging device according to an embodiment of the present invention.
Figure 9:
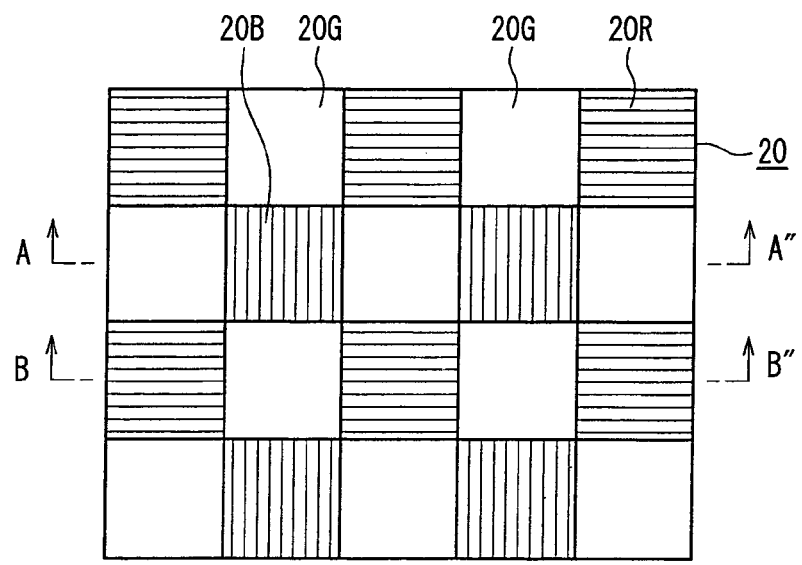
FIG. 9 is a plan view showing an example of a three primary color filter of a Bayer arrangement in a conventional solid-state imaging device.
Figure 10:
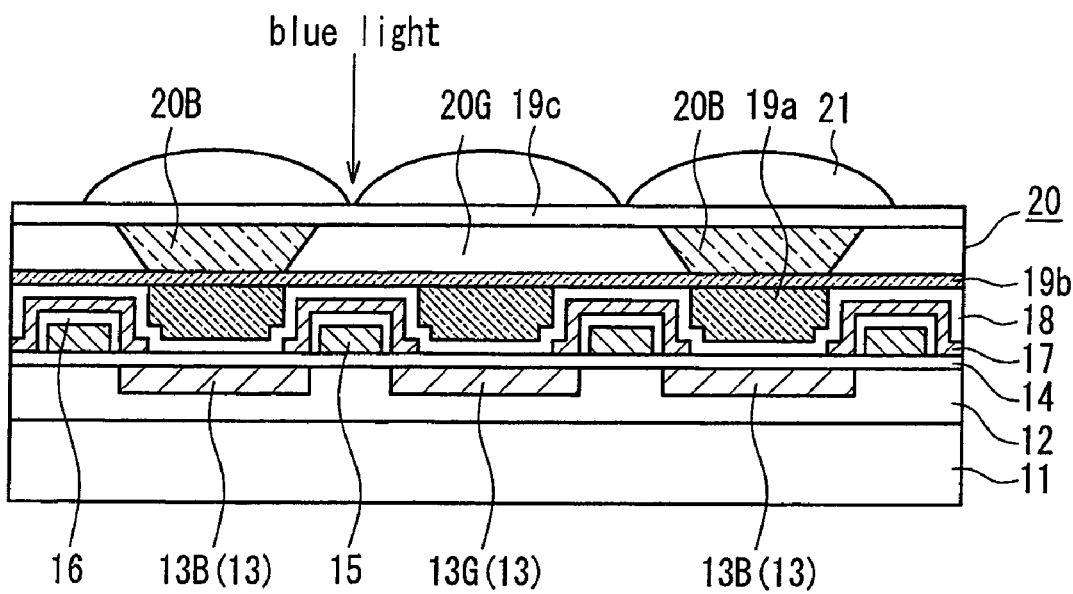
FIG. 10 is a diagram schematically showing a cross section of the conventional solid-state imaging device taken along an A-A" line of FIG. 9.
Figure 11:
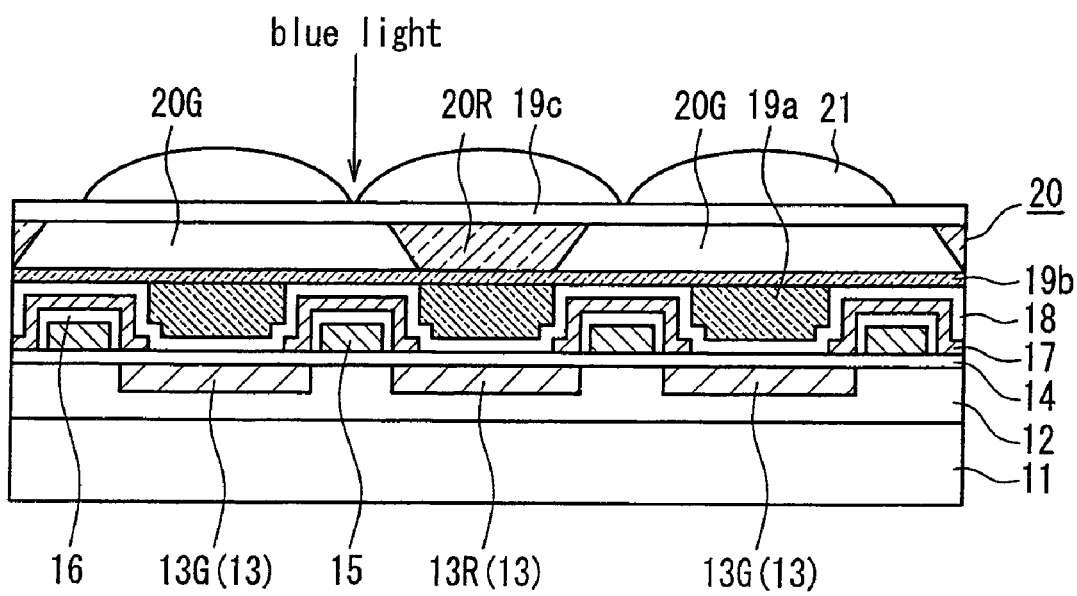
FIG. 11 is a diagram schematically showing a cross section of the conventional solid-state imaging device taken along a B-B" line of FIG. 9.
Figure 12:
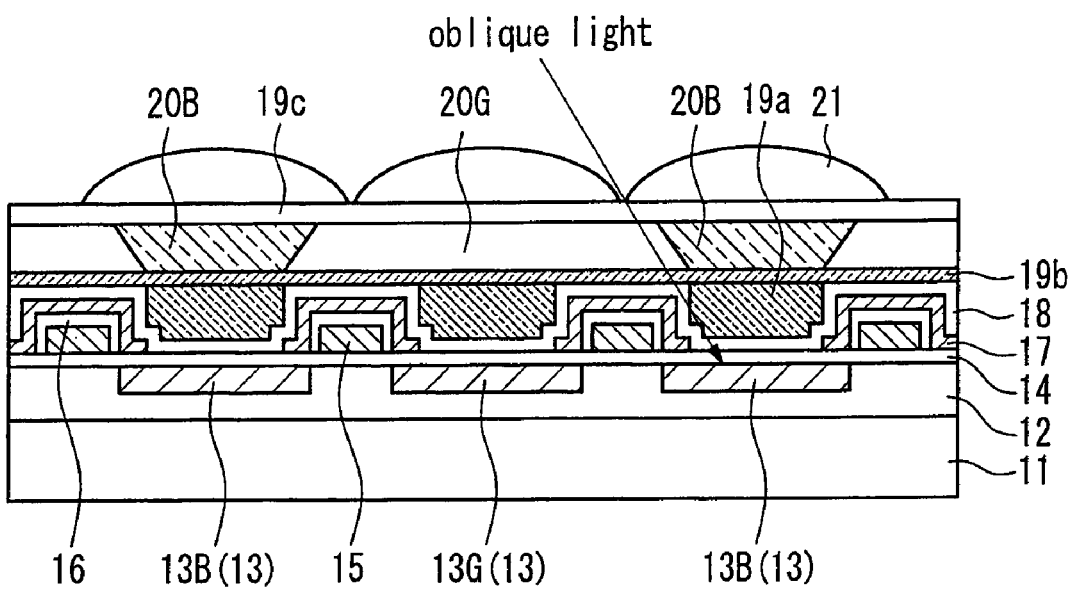
FIG. 12 is a diagram showing a state in which oblique light is incident in the cross section of the conventional solid-state imaging device taken along the A-A" line of FIG. 9.
Figure 13:
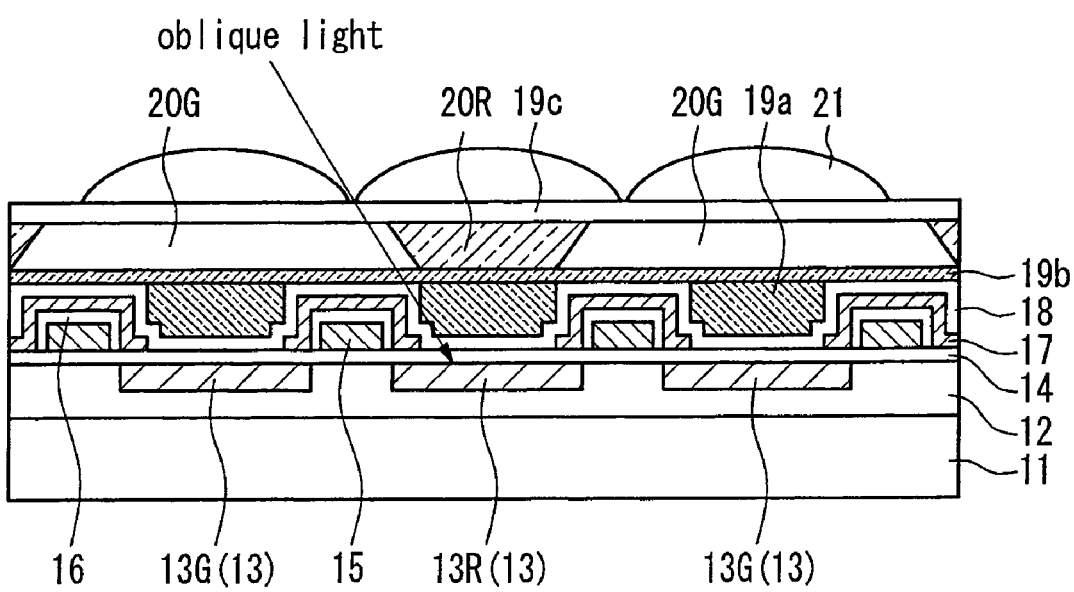
FIG. 13 is a diagram showing a state in which oblique light is incident in the cross section of the conventional solid-state imaging device taken along the B-B" line of FIG. 9.

FIG. 1 is a diagram schematically showing a cross-sectional configuration of a solid-state imaging device according to an embodiment of the present invention. This figure corresponds to FIG. 10 referred to for describing the prior art, and in the figure, like reference characters indicate elements having the same functions as in FIG. 10. Further, this figure shows a cross section along the A-A" line of FIG. 9, which corresponds to a cross section including three photoelectric conversion elements. In the following description, a cross section along the A-A" line of FIG. 9 is referred to also simply as an A-A" cross section, and similarly, a cross section along the B-B" line is referred to also simply as a B-B" cross section.

A solid-state imaging device 10 shown in the figure is composed of a first conduction-type (for example, a N-type) semiconductor substrate (N-type semiconductor substrate) 11, a second conduction-type (a P-type) semiconductor well (P-well) layer 12, a plurality of photoelectric conversion elements 13, a gate insulation film 14, a transfer electrode 15, an interlayer insulation film 16, a light-blocking film 17, a surface protection film 18, a first transparent planarization film 19a, a second transparent planarization film 19b, green color filter portions 22 that are formed in a lattice form when viewed in a plan view, color filter layers 20 (20G, 20B and 20R shown in FIG. 3), a third transparent planarization film 19c, a microlens 21 and the like.

First, the P-well layer 12 having a characteristic inverted from that of the N-type semiconductor substrate 11 is formed on a surface of the N-type semiconductor substrate 11. A plurality of N-type semiconductor regions are formed on a surface of the P-well layer 12, constituting the plurality of photoelectric conversion elements 13 that are arranged in a matrix form when viewed in a plan view. The gate insulation film 14 is formed on the respective surfaces of the P-well layer 12 and the photoelectric conversion elements 13.

Moreover, on the gate insulation film 14, the transfer electrode 15 made of polycrystalline silicon is formed in a boundary region between the photoelectric conversion elements 13.

The interlayer insulation film 16 is formed on a surface of transfer electrode 15, which provides the surface with insulation coating, and the light-blocking film 17 made of tungsten or the like is formed further on the interlayer insulation film 16. The light-blocking films 17 are formed on an entire surface except for respective openings of the photoelectric conversion elements 13. The surface protection film 18 made of SiON or the like is formed on respective surfaces of the light-blocking films 17 and the gate insulation film 14. As a result, a concave portion is formed in an upper region of each of the photoelectric conversion elements 13, and the first transparent planarization film 19a is formed so as to fill the concave portion to be flush with a surface of the surface protection film 18. The first transparent planarization film 19a permits the green color filter portions 22 and the color filter layers 20 to be formed with high precision and is formed by known process steps of coating, exposure and development using a photosensitive transparent film whose main component is a phenol resin or the like.

After that, when forming the green color filter portions 22 provided in a lattice form when viewed in a plan view and the color filter layers 20, the second transparent planarization film 19b made of an acrylic transparent resin is coated for the purposes of reducing a development residue and obtaining an improved adhesion property.

A green color resist is coated further, and then exposure and development treatments are performed using a photomask designed to provide a width smaller than that of the light-blocking film 17. Thus, each of the green color filter portions 22 in a lattice form is formed above the light-blocking film 17 so as to have a width smaller than that of the light-blocking film 17. Above the boundary region between the photoelectric conversion elements 13, each of the green color filter portions 22 is formed on the second transparent planarization film 19b coated on the surface of the surface protection film 18 so as to have a cross section of a mountain shape or a trapezoidal shape.

After that, a first (green) color filter resist material is coated, and exposure and development treatments are performed using a photomask designed to allow the green color filter layers 20G to be formed in a checkered pattern. Thus, first (green) color filter layers 20G are formed.

After that, similar process steps are performed to form second (for example, blue) color filter layers 20B and third (for example, red) color filter layers 20R sequentially. In this manner, each of the color filter layers 20G, 20B and 20R is formed between respective ridgelines of the green color filter portions 22. The color filter layers have a thickness smaller at a peripheral portion corresponding to a ridgeline portion of the green color filter portion 22 than at a central portion. This can increase a process margin (a focus margin, an exposure margin or the like). Further, this can ensure a sharp cross-sectional shape of an edge portion.

Furthermore, since a color resist containing a pigment has a low transmittance with respect to ultraviolet rays (for example, i-rays), when a color resist having an increased thickness is used, light hardly reaches a back side (lower portion) of the color resist. As a result, resolution at a bottom portion of each pixel is deteriorated, and along with this, film peeling becomes more likely to occur. In this embodiment, however, since each of the color filter layers 20G, 20B and 20R is formed so as to have a thickness smaller at a peripheral portion than at a central portion, it is possible to form a color filter with excellent dimensional precision and suppress the occurrence of film peeling.

Next, in order to form the microlens 21 to be formed later with high precision, after coating and baking of a thermosetting transparent resin whose main component is an acrylic resin are repeated plural times, a known etchback method employing dry etching is performed so that the third transparent planarization film 19c is formed. Subsequently, a phenol photosensitive transparent resin is coated and subjected to process steps of exposure and development so that the microlens 21 is formed.

As described above, the green color filter portions 22 provided in a lattice form when viewed in a plan view are formed first, and each of the color filter layers 20G, 20B and 20R that are formed after that has a thickness smaller at a peripheral portion than at a central portion above the photoelectric conversion element 13, and thus it is possible to form an edge portion of each of the color filter layers 20G, 20B and 20R with high precision. As a result, the problem of line shading is remedied with respect to white light, blue light and red light.

Furthermore, when the problem of line shading is remedied by the conventional method in which green color filter layers are formed in an increased size (blue color filter layers and red color filter layers are formed in a decreased size), as previously described, there is increased vulnerability to oblique incident light and color mixture becomes more likely to occur. According to the configuration of this embodiment, however, it is possible both to remedy the problem of line shading and to suppress color mixture. With reference to the appended drawings, the following explains how this can be achieved.

Figure 2:
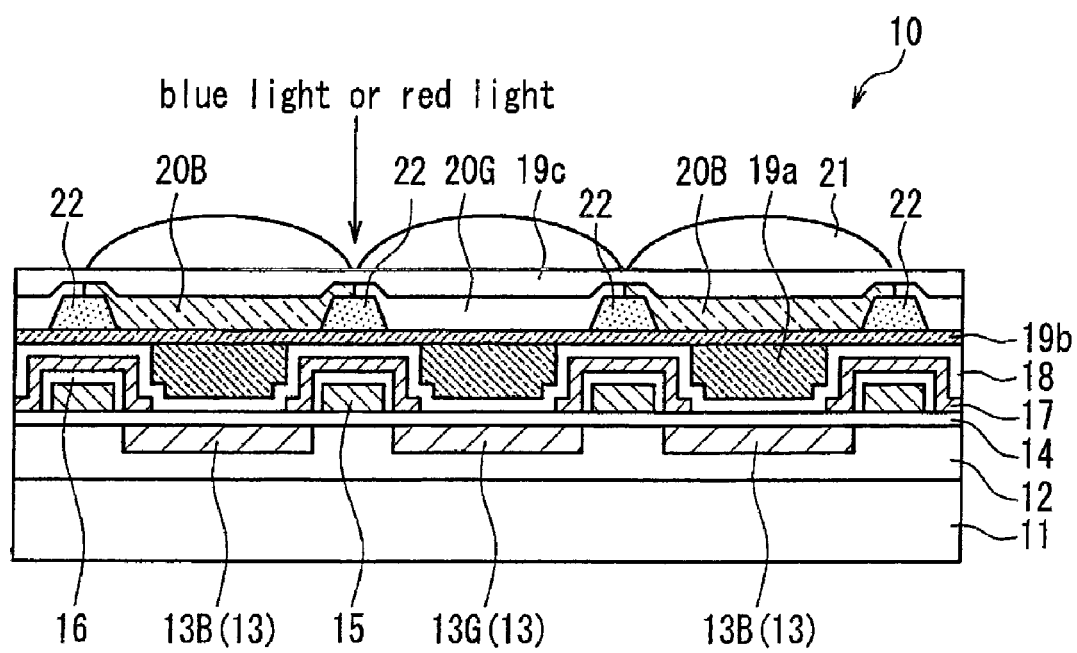
FIG. 2 is a diagram showing a state in which light is incident on a boundary portion between pixels in a cross section including a blue color filter layer in the solid-state imaging device according to the embodiment.

FIG. 2 is a diagram showing a state in which light is incident on a boundary portion between pixels in a cross section including a blue color filter layer in the solid-state imaging device according to this embodiment. This cross section is equivalent to the cross section (A-A" cross section) shown in FIG. 1. It is assumed herein that, as shown in FIG. 2, blue light or red light is incident substantially perpendicularly from a boundary portion between pixels, i.e. from above the light-blocking film 17. In the case where blue light is incident, a major portion of blue light is absorbed by the green color filter portion 22, and thus an amount of light reflected diffusely on the surface of the light-blocking film 17 or the like is decreased. As a result, the amount of light received at the photoelectric conversion element 13G of a green pixel interposed between blue pixels hardly increases. Further, also in the case where red light is incident, a major portion of red light is absorbed by the green color filter portion 22, and thus the amount of light reflected diffusely on the surface of the light-blocking film 17 or the like is decreased. As a result, the amount of light received at the photoelectric conversion element 13G of a green pixel interposed between blue pixels hardly increases.

Figure 3:
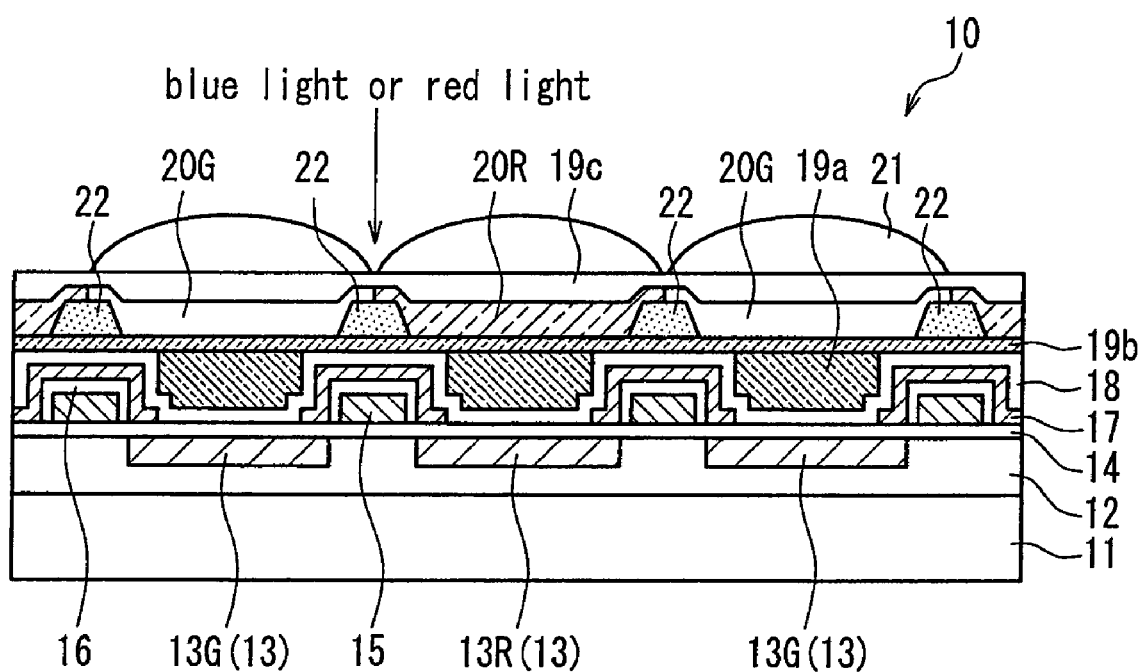
FIG. 3 is a diagram showing a state in which light is incident on a boundary portion between pixels in a cross section including a red color filter layer in the solid-state imaging device according to the embodiment.

FIG. 3 is a diagram showing a state in which light is incident on a boundary portion between pixels in a cross section including a red color filter layer in the solid-state imaging device according to this embodiment. This cross section is equivalent to the cross section on the B-B" line of FIG. 9. It is assumed herein that, as shown in FIG. 3, blue light or red light is incident substantially perpendicularly on a boundary portion between pixels, i.e. from above the light-blocking film 17. In the case where blue light is incident, a major portion of the blue light is absorbed by the green color filter portion 22, and thus the amount of light reflected diffusely on the surface of the light-blocking film 17 or the like is decreased. As a result, an amount of light received at a green pixel 13G interposed between red pixels hardly increases. Further, also in the case where red light is incident, a major portion of the red light is absorbed by the green color filter portion 22, and thus the amount of light reflected diffusely on the surface of the light-blocking film 17 or the like is decreased. As a result, the amount of light received at the photoelectric conversion element 13G of a green pixel interposed between red pixels hardly increases.

Based on the above-described reason, in either of the case where blue light is incident and the case where red light is incident, no difference is produced between an amount of light received by the photoelectric conversion element 13G of a green pixel interposed between blue pixels and an amount of light received by the photoelectric conversion element 13G of a green pixel interposed between red pixels. That is, the problem of line shading is remedied with respect to both of blue light and red light.

Figure 4A:
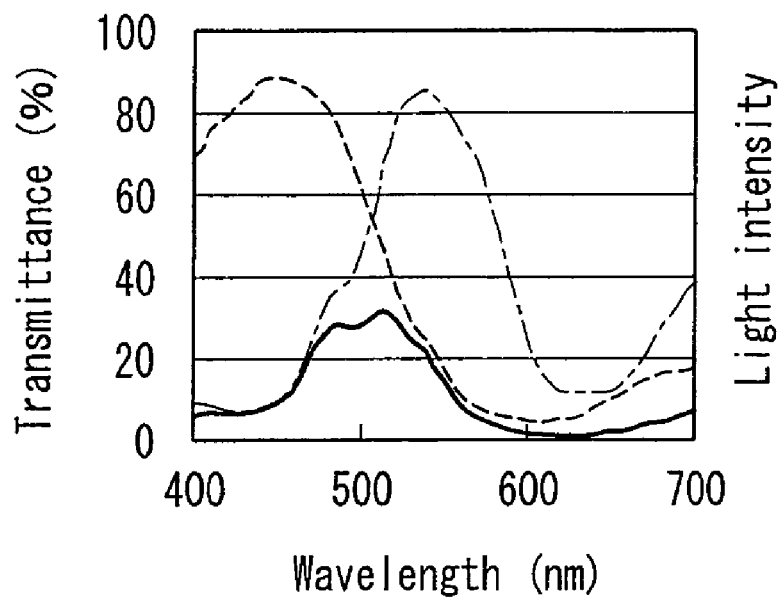
FIGS. 4A and 4B are graphs showing spectral characteristics in the case where red light or blue light is absorbed in a green color filter portion.
Figure 4B:
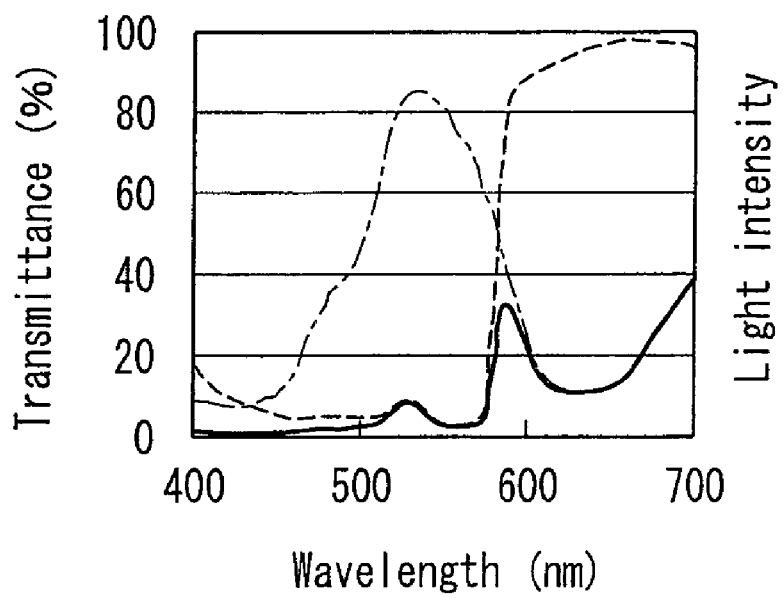

FIGS. 4A and 4B are graphs showing spectral characteristics of transmitted light in the case where red light or blue light is allowed to be incident on a green color filter portion 22. In each of FIGS. 4A and 4B, with respect to both vertical axes, a left axis indicates a transmittance and a right axis indicates light intensity. In FIG. 4A, a broken line indicates a spectral intensity characteristic of incident blue light, and an alternate long and short dashed line indicates a spectral transmittance characteristic of the green color filter portion 22. A solid line indicates a spectral intensity characteristic of light transmitted through the green color filter portion 22 in the case where blue light is allowed to be incident. Understandably, in a configuration without the green color filter portion 22, blue light (having the spectral characteristic indicated by the broken line) is transmitted as it is.

In FIG. 4B, a broken line indicates a spectral intensity characteristic of incident red light, and an alternate long and short dashed line indicates a spectral transmittance characteristic of the green color filter portion 22. A solid line indicates a spectral intensity characteristic of light transmitted through the green color filter portion 22 in the case where red light is allowed to be incident. Understandably, in the configuration without the green color filter portion 22, red light (having the spectral characteristic indicated by the broken line) is transmitted as it is.

Figure 5:
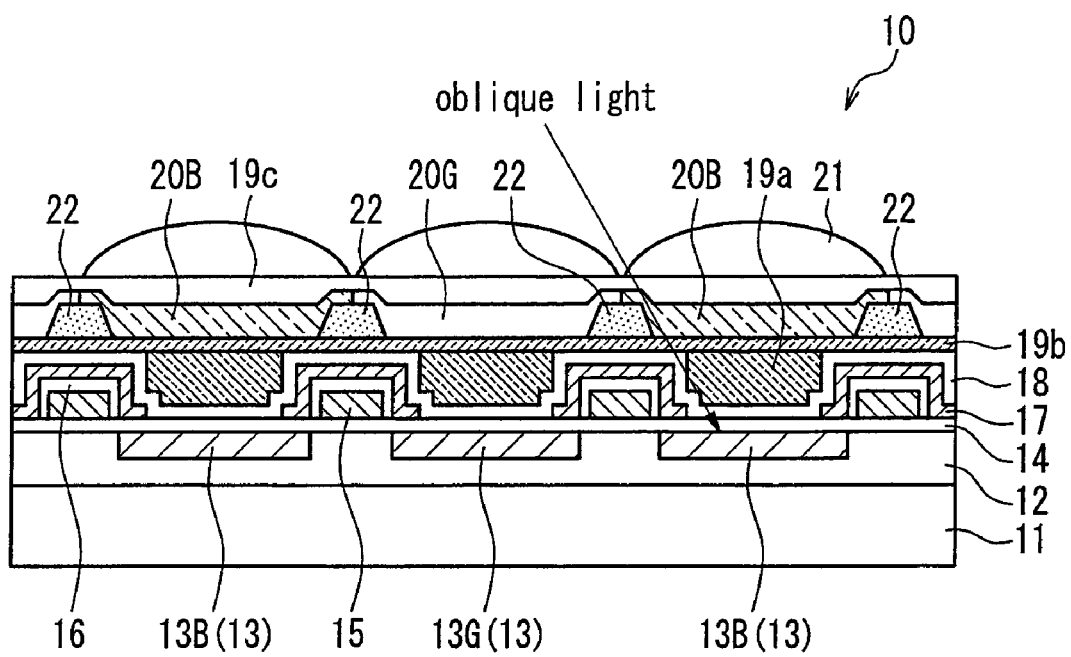
FIG. 5 is a diagram showing a state in which oblique light is incident in the cross section including the blue color filter layer in the solid-state imaging device according to the embodiment.
Figure 6:
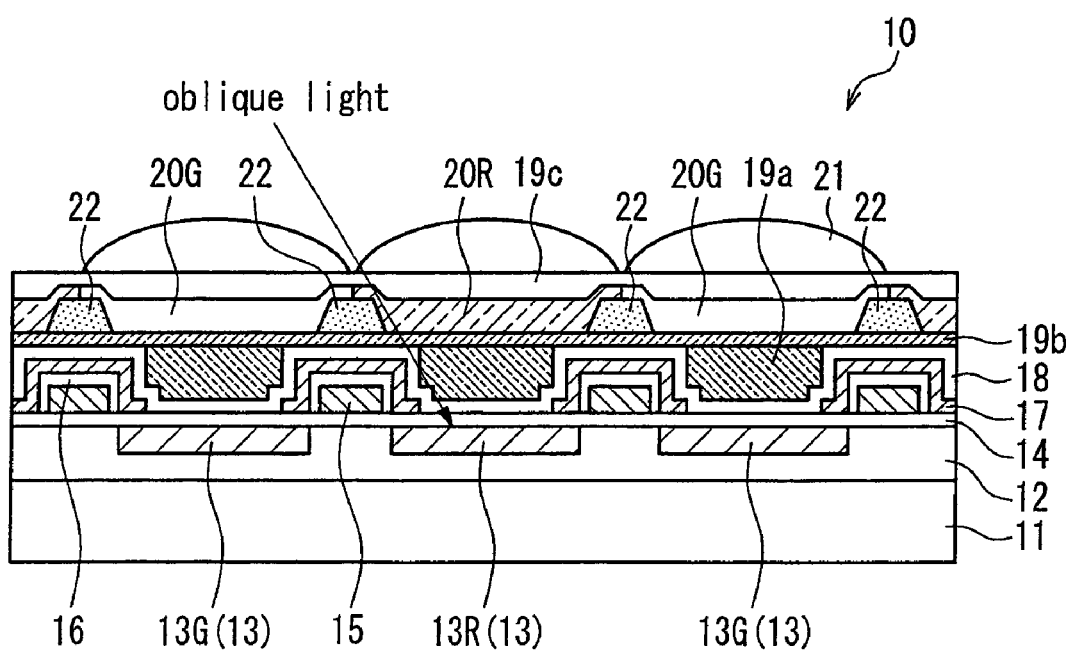
FIG. 6 is a diagram showing a state in which oblique light is incident in the cross section including the red color filter layer in the solid-state imaging device according to the embodiment.

The description is directed next to an operation in the case where oblique light is incident with reference to FIGS. 5 and 6. FIG. 5 shows a state in which oblique light is incident in the A-A" cross section of the solid-state imaging device according to this embodiment, and FIG. 6 shows a state in which oblique light is incident in the B-B" cross section of the solid-state imaging device according to this embodiment. As shown in FIG. 5, in the case where oblique light is incident on the photoelectric conversion element 13B of a blue pixel, in the solid-state imaging device according to this embodiment, the oblique incident light does not pass through the green color filter portion 22, and thus color mixture is unlikely to occur. Similarly, as shown in FIG. 6, in the case where oblique light is incident on the photoelectric conversion element 13R of a red pixel, in the solid-state imaging device according to this embodiment, the oblique incident light does not pass through the green color filter portion 22, and thus color mixture is unlikely to occur.

As explained above, the solid-state imaging device according to this embodiment has the above-described structural features, and thus in the case where oblique light is incident, it is unlikely that the influence of another color filter layer (green color filter layer 20G) adjacent to a color filter layer of an intended pixel is present, thereby preventing the occurrence of color mixture at a blue pixel or a red pixel interposed between green pixels. Further, a phenomenon is prevented in which the sensitivity of a blue pixel or a red pixel interposed between green pixels is increased due to color mixture caused by light from either one of the green pixels adjacent thereto.

Furthermore, in the solid-state imaging device according to this embodiment, the green color filter portions 22 are formed in a lattice form when viewed in a plan view so as to have a cross section of a mountain shape or a trapezoidal shape, and after that, the green color filter layers 20G are formed. In this case, each of the green color filter layers 20G is formed so as to have a thickness smaller at a peripheral portion than at a central portion and thus has a stable edge portion.

Furthermore, similarly, each of the blue color filter layers 20B and the red color filter layers 20R that are formed sequentially subsequent to the formation of the green color filter layers 20G is formed so as to have a thickness smaller at a peripheral portion corresponding to a ridgeline of the green color filter portion 22 than at a central portion. Therefore, a spectral characteristic weakens at the peripheral portion, thereby reducing the influence of color mixture attributable to an alignment deviation.

Furthermore, the green color filter layers 20G are made thinner at their peripheral portions formed respectively on the green color filter portions 22, and thus a dimension approximate to that of a photomask is realized with high reproducibility. As a result, it is possible to prevent, in the case where oblique light is incident, the occurrence of color mixture caused by light from an adjacent color filter layer depending on dimensional precision of color filter layers, thereby allowing variations in sensitivity and color irregularity to be reduced.

Figure 7:
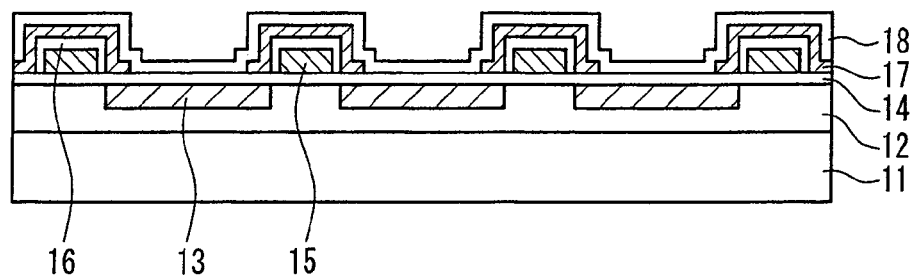
FIG. 7 is a diagram showing process steps of manufacturing the solid-state imaging device according to the embodiment of the present invention, particularly a state in which the process steps up to the formation of a surface protection film have been completed.
Figure 8:
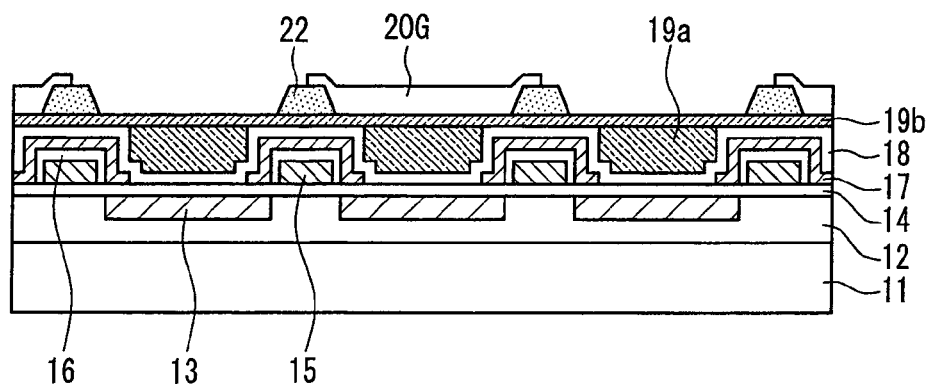
FIG. 8 is a diagram showing the process steps of manufacturing the solid-state imaging device according to the embodiment of the present invention, particularly a state in which the process steps up to the formation of green color filter layers have been completed.

Next, a method of manufacturing the solid-state imaging device 10 having the above-described structure will be described with reference to FIGS. 7 and 8 as well as FIG. 1. FIG. 7 is a cross-sectional view showing an intermediate stage in process steps of manufacturing the solid-state imaging device according to this embodiment. FIG. 8 is a cross-sectional view showing a state in a process step advanced further from a state shown in FIG. 7.

First, process steps up to the stage shown in a cross section of FIG. 7 will be described in (1) to (4) below. The cross section of FIG. 7 shows the state in which sequential film formation on the N-type semiconductor substrate 11 up to the formation of the surface protection film 18 has been completed.

(1) The P-well layer 12 having a characteristic inverted from that of the N-type semiconductor substrate 11 is formed on the N-type semiconductor substrate 11, and on the surface of the P-well layer 12, a plurality of N-type diffusion layers (photoelectric conversion elements) 13 are formed in a matrix form when viewed in a plan view. Generally, the P-well layer 12 and the N-type diffusion layers (photoelectric conversion elements) 13 are formed by process steps of photolithography, ion injection and heat diffusion that are performed repeatedly.

(2) After completing the formation of the photoelectric conversion elements 13, the gate insulation film 14 is formed on the respective surfaces of the P-well layer 12 and the photoelectric conversion elements 13. After that, the transfer electrode 15 made of polycrystalline silicon is formed on the gate insulation film 14. The transfer electrode 15 is formed in a boundary region between the photoelectric conversion elements 13. The interlayer insulation film 16 that provides the surface of the transfer electrode 15 with an electrically insulating coating and the light-blocking film 17 made of tungsten or the like are formed sequentially.

(3) After completing the formation of the light-blocking film 17, on the respective surfaces of the gate insulation film 14 and the light-blocking films 17, for example, as the surface protection film 18, a BPSG film (boron-phosphosilicate glass) formed by a thermal flow process, a SiON film or the like is formed. At this point in time, a concave portion (recess) has been formed in a portion above each of the photoelectric conversion elements 13, i.e. between the transfer electrodes 15.

(4) Wiring (not shown) made of an aluminum alloy or the like is formed further, and, for example, a SiON film or the like is deposited so that the wiring is protected. After that, a bonding pad (not shown) for extracting an electrode is formed.

FIG. 8 shows in a cross section the state in the process step advanced further from the state shown in FIG. 7, i.e. a state in which process steps up to the formation of the green color filter layers 20G that are the first color filter layers have been completed. Manufacturing process steps from the state shown in the cross section of FIG. 7 to the state shown in the cross section of FIG. 8 will be described in (5) to (8) below.

(5) As a pretreatment for forming the green color filter portions 22 to be formed later in a lattice form when viewed in a plan view and the color filter layers 20 with high precision, the first transparent planarization film 19a that fills the concave portion between convex portions formed by, for example, a wiring region formed of an aluminum alloy or the like and the transfer electrode 15 made of polycrystalline silicon or the like is formed on the surface protection film 18. The first transparent planarization film 19a is formed by a method in which, using a predetermined photomask, for example, a photosensitive transparent resist whose main component is a phenol resin is coated and subjected to exposure and development (including bleaching and baking). Thus, the first transparent planarization film 19a having a transmittance increased by ultraviolet irradiation is formed so as to fill the concave portion above each of the photoelectric conversion elements 13.

(6) Next, as a pretreatment for forming the green color filter portions 22 to be formed later in a lattice form when viewed in a plan view and the color filter layers 20 with high precision, the second transparent planarization film 19b made of, for example, an acrylic thermosetting transparent resin, is coated and subjected to a heat treatment to be cured.

(7) Then, a portion to be in contact with an edge portion of each of the color filter layers 20 to be formed later, i.e. a non-light-receiving region that is present between each pair of adjacent ones of the photoelectric conversion elements 13, or to put it still another way, above the transfer electrode 15 and the light-blocking film 17, the green color filter portion 22 is formed so as to form a lattice when viewed in a plan view. The green color filter portions 22 are formed by a method in which a photosensitive negative-type green color resist is coated and subjected to process steps of exposure and development using a predetermined photomask. The green color filter portion 22 has a width equal to or smaller than a width of the light-blocking film 17. Further, the green color filter portion 22 is formed so as to have a cross section of a mountain shape or a trapezoidal shape. The photomask used in this case is a photomask designed to provide a width smaller than that of the light-blocking film 17. Further, it also is possible that a photomask designed for the formation of the microlens 21 is used also to form the green color filter portions 22. In this case, a negative-type green color resist of the same type as used for forming the green color filter layers 20G could be used to form the green color filter portions 22, and a positive-type transparent resist could be selected as a material for forming the microlens 21. After completing the formation of the green color filter portions 22 provided in a lattice form when viewed in a plan view, for example, a HMDS (hexamethyldisilazane) film is vapor-coated, and subsequently, for example, a green color resist for forming the green color filter layers 20G is coated. This resist contains a dye or a pigment that is prepared so as to allow light having a wavelength range of green light to be transmitted selectively. A configuration without the HMDS film also is possible as long as it causes no problem. Further, as a material for forming the green color filter portions 22 provided in a lattice form when viewed in a plan view, a green negative-type color resist of the same type as used for forming the green color filter layers 20G can be used.

(8) Subsequently, the green negative-type color resist that has been coated is exposed and developed using a predetermined photomask. This photomask is designed in a checkered pattern so as to allow each of the green color filter layers 20G to be formed above the photoelectric conversion element 13 at a predetermined location.

Next, process steps from the state shown in the cross section of FIG. 8 to the state shown in the cross section of FIG. 1, i.e. manufacturing process steps up to the formation of the microlens 21 after the formation of the green color filter layers 20G will be described in (9) to (12) below.

(9) Subsequent to the formation of the green color filter layers 20G, the blue color filter layers 20B and the red color filter layers 20R are formed in predetermined positions, respectively. The color filter layers 20B and 20R are formed by a method similar to the above-described method for forming the green color filter layers 20G.

(10) Moreover, in order to form the microlens 21 to be formed later with high precision, for example, a thermosetting transparent resin whose main component is an acrylic resin is coated on the color filter layers 20G, 20B and 20R and a curing treatment in which the resin is baked using a hot plate is repeated plural times, and thus the third transparent planarization film 19c for planarizing a surface after the formation of the color filter layers 20 is formed.

(11) Then, in order to reduce a distance from a light-receiving surface to respective surfaces of the color filter layers 20G, 20B and 20R so as to obtain improved sensitivity, the third transparent planarization film 19c is etched to a thickness as small as possible by the known etchback method.

(12) After that, on a surface of the third transparent planatization film 19c, a photosensitive positive-type transparent resist whose main component is a phenol resin is coated above the photoelectric conversion element 13 and is subjected to process steps of exposure and development (including bleaching and baking), and thus the microlens 21 that projects up is formed. The microlens 21 is subjected to ultraviolet irradiation so as to have an increased transmittance. In order to prevent deterioration of the spectral characteristics of the color filter layers 20G, 20B and 20R, it is desirable that post baking of the microlens 21 is performed at a treatment temperature of not higher than 200° C.

The solid-state imaging device 10 shown in FIG. 1 can be manufactured by the above-described process steps. According to the solid-state imaging device 10 of this embodiment, the green color filter portions 22 are formed in a lattice form when viewed in a plan view, and each of the color filter layers 20G, 20B and 20R to be formed after that is formed so as to have a thickness smaller at a peripheral portion than at a central portion above the photoelectric conversion element 13, and thus it is possible to form the color filter layers 20G, 20B and 20R with high precision. As a result, variations in sensitivity with respect to white light, red light and blue light can be reduced, thereby remedying the problems of line shading and color irregularity.

As explained above, according to the solid-state imaging device of the embodiment of the present invention, the green color filter portion 22 is formed in contact with an edge portion of the color filter layer 20 of an adjacent pixel so as to have a cross section of a mountain shape or a trapezoidal shape in a direction perpendicular to a boundary portion, and after that, the color filter layers 20 are formed. Therefore, the shape of the edge portion of each of the color filter layers 20 at a boundary portion becomes more approximate to a perpendicular shape, and thus the problem of dimensional variations is remedied, thereby allowing each of the color filter layers 20 to be formed so as to have an excellent edge portion.

As a result, it is possible to prevent the occurrence of color mixture caused by light from an adjacent color filter layer among the color filter layers 20 due to the incidence of oblique light, thereby allowing a solid-state imaging device to provide high-definition images.

Moreover, each of the color filter layers 20 can be formed so as to have a thickness decreased at a peripheral portion, thereby allowing each of the color filter layers 20 to be formed above the photoelectric conversion element 13 with high precision. As a result, the occurrence of color irregularity between pixels is prevented, thereby allowing a solid-state imaging device to remedy the problems of line shading and color shading.

As a method of forming the first transparent planarization film 19a under the color filter layers 20, various methods can be employed. Examples of the methods include: a method in which a photosensitive transparent film is coated and then is subjected to exposure and development treatments to fill each concave portion on a surface of a base material; a method in which coating of a transparent film is performed plural times and followed by planarization by a known etchback process; a method in which a transparent film is coated and then is planarized by a thermal flow treatment; and a method in which these methods are performed in combination so that a planarization property is improved further.

Furthermore, the green color filter portions 22 provided in a lattice form when viewed in a plan view are formed by the following method. That is, a green-pigment-dispersed color resist or a green-dye-internally-added color resist is coated and then is subjected to exposure and development treatments using a photomask for forming the microlens 21 or a photomask designed to provide a width equal to or smaller than that of the light-blocking film 17. By this manufacturing method, the solid-state imaging device 10 having the above-described configuration, function and effect can be manufactured.

The foregoing described the solid-state imaging device and the manufacturing method according to the embodiment of the present invention. However, the present invention is not limited to this embodiment and may be modified variously within the scope of the invention.

For example, although in the above-described embodiment, as an example, the color filter layers 20 were of a primary color system used in a solid-state imaging device intended mainly to provide a superior color tone, color filter layers of a complementary color system used in a solid-state imaging device intended mainly to provide superior resolution and sensitivity also may be used. In the case of employing the complementary color system, as color filter layers, color filter layers for magenta light, color filter layers for green light, color filter layers for yellow light, and color filter layers for cyan light are formed in positions determined according to a known color arrangement, respectively.

Furthermore, as materials for forming the color filter layers 20, a dye-internally-added color resist, a pigment-dispersed color resist and the like are known. Any one of these materials can be used selectively and it also is possible to use them in combination.

Furthermore, the known photolithography technique using a photosensitive transparent resin was described in regard to the formation of the first transparent planarization film 19a. However, there also is another method in which a thermosetting transparent resin material is coated and subjected to heat-curing plural times, and a known etchback method is performed.

Furthermore, after forming the first transparent planarization film 19a, for the purpose of improving an adhesion property of the color filter layers 20 and the green color filter portions 22 provided in a lattice form when viewed in a plan view, a thermosetting transparent resin material (or a HMDS film) whose main component is an acrylic resin was employed but can be omitted as long as sufficient adhesion strength is ensured.

Furthermore, although the above-described embodiment was directed to the case where the present invention was applied to a CCD type solid-state imaging device, the present invention is not limited thereto and also can be applied to amplifying solid-state imaging devices of, for example, a MOS type or solid-state imaging devices of other types.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   a semiconductor substrate;
   a plurality of photoelectric conversion elements that are arranged on the semiconductor substrate; and
   color filter layers of a plurality of colors that are formed in a predetermined pattern above the plurality of photoelectric conversion elements,
   wherein a green color filter portion having a predetermined width is formed above a boundary region between each pair of adjacent ones of the photoelectric conversion elements so as to have a cross section of a mountain shape or a trapezoidal shape,
   each of the color filter layers of a plurality of colors is formed between respective ridgelines of the green color filter portions so as to have a thickness that is smaller at a peripheral portion positioned in a ridgeline portion of the green color filter portion than at a central portion, and
   the green color filter portion is formed with a dye-internally-added color resist.

2. The solid-state imaging device according to claim 1, wherein the green color filter portion is formed so as to have a thickness equal to or smaller than a thickness at a central portion of the color filter layers.

3. The solid-state imaging device according to claim 2, wherein the green color filter portion is formed so as to have a width equal to or smaller than a width of a light-blocking film that is formed on a transfer electrode formed above the boundary region between each pair of adjacent ones of the photoelectric conversion elements.

4. The solid-state imaging device according to claim 1, wherein the green color filter portion is formed so as to have a width equal to or smaller than a width of a light-blocking film that is formed on a transfer electrode formed above the boundary region between each pair of adjacent ones of the photoelectric conversion elements.

5. The solid-state imaging device according to claim 1, wherein the color filter layer is formed with a pigment-dispersed color resist.

6. The solid-state imaging device according to claim 1, wherein the color filter layer is formed with a dye-internally-added color resist.

7. The solid-state imaging device according to claim 1, wherein a bottom face of the green color filter portion and a bottom face of the color filter layer are formed to be flush with each other.

8. A solid-state imaging device, comprising:

a semiconductor substrate;

a plurality of photoelectric conversion elements that are arranged in a matrix form on the semiconductor substrate; and color filter layers of a plurality of colors that are formed in a predetermined pattern above the plurality of photoelectric conversion elements, wherein a green color filter portion having a predetermined width is formed above a boundary region between each pair of adjacent ones of the photoelectric conversion elements so as to form a lattice when viewed in a plan view and have a cross section of a mountain shape or a trapezoidal shape, each of the color filter layers of a plurality of colors is formed in a rectangular region interposed between respective ridgelines of the green color filter portions, and the green color filter portion is formed with a dye-internally-added color resist.

9. The solid-state imaging device according to claim 8, wherein each of the color filter layers is formed so as to have a thickness that is smaller at a peripheral portion positioned in a ridgeline portion of the green color filter portion than at a central portion.

10. The solid-state imaging device according to claim 9, wherein the green color filter portion is formed so as to have a thickness equal to or smaller than a thickness at a central portion of the color filter layers.

11. The solid-state imaging device according to claim 9, wherein the green color filter portion is formed so as to have a width equal to or smaller than a width of a light-blocking film that is formed on a transfer electrode formed above the boundary region between each pair of adjacent ones of the photoelectric conversion elements.

12. The solid-state imaging device according to claim 8, wherein the green color filter portion is formed so as to have a thickness equal to or smaller than a thickness at a central portion of the color filter layers.

13. The solid-state imaging device according to claim 8, wherein the green color filter portion is formed so as to have a width equal to or smaller than a width of a light-blocking film that is formed on a transfer electrode formed above the boundary region between each pair of adjacent ones of the photoelectric conversion elements.

14. A solid-state imaging device, comprising:

a semiconductor substrate;

a plurality of photoelectric conversion elements that are arranged on the semiconductor substrate; and color filter layers of a plurality of colors that are formed in a predetermined pattern above the plurality of photoelectric conversion elements, wherein a filter portion having a predetermined width is formed above a boundary region between each pair of adjacent ones of the photoelectric conversion elements, and each of the color filter layers of a plurality of colors is formed between each pair of adjacent ones of the filter portions, the filter portion is formed with a dye-internally-added color resist, and the filter portion is formed so as to have a width equal to or smaller than a width of a light-blocking film that is formed on a transfer electrode formed above the boundary region between each pair of adjacent ones of the photoelectric conversion elements.

15. The solid-state imaging device according to claim 14, wherein a bottom face of the filter portion and a bottom face of the color filter layer are formed to be flush with each other.

* * * * *